US011476805B2

(12) United States Patent
Clarkin et al.

(10) Patent No.: US 11,476,805 B2
(45) Date of Patent: Oct. 18, 2022

(54) AMPLIFIER SYSTEMS

(71) Applicant: Cirrus Logic International Semiconductor Ltd., Edinburgh (GB)

(72) Inventors: Philip Clarkin, Austin, TX (US); Ivan Perry, Penicuik (GB); Mark H. Tovell, Edinburgh (GB); Roberto Napoli, Milan (IT); David Rhodes, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 116 days.

(21) Appl. No.: 16/850,248

(22) Filed: Apr. 16, 2020

(65) Prior Publication Data
US 2021/0175852 A1 Jun. 10, 2021

Related U.S. Application Data

(60) Provisional application No. 62/944,030, filed on Dec. 5, 2019.

(51) Int. Cl.
| | |
|---|---|
| *H03F 1/02* | (2006.01) |
| *H04R 3/00* | (2006.01) |
| *H03M 1/12* | (2006.01) |
| *H03F 3/217* | (2006.01) |

(52) U.S. Cl.
CPC ........... *H03F 1/0227* (2013.01); *H03F 3/217* (2013.01); *H03M 1/12* (2013.01); *H04R 3/007* (2013.01); *H03F 2200/03* (2013.01)

(58) Field of Classification Search
CPC ........ H04R 3/007; H03M 1/12; H03F 1/0227; H03F 3/217; H03F 2200/03
See application file for complete search history.

(56) References Cited

U.S. PATENT DOCUMENTS

| | | | |
|---|---|---|---|
| 8,421,540 B1* | 4/2013 | Bhattacharya | H03F 3/185 330/298 |
| 9,301,046 B1* | 3/2016 | Das | H04R 3/04 |
| 2007/0210771 A1* | 9/2007 | Wilson | H03F 3/19 323/278 |
| 2012/0200354 A1* | 8/2012 | Ripley | H03F 3/193 330/131 |

(Continued)

FOREIGN PATENT DOCUMENTS

EP   2453669 A1   5/2012

OTHER PUBLICATIONS

Combined Search and Examination Report under Sections 17 and 18(3), UKIPO, Application No. GB2018786.0, dated May 27, 2021.

(Continued)

*Primary Examiner* — Daniel R Sellers
(74) *Attorney, Agent, or Firm* — Jackson Walker L.L.P.

(57) ABSTRACT

The present disclosure relates to circuitry comprising: amplifier circuitry configured to receive a variable supply voltage, wherein the supply voltage varies according to an output signal of the amplifier circuitry; monitoring circuitry configured to monitor one or more parameters of an output signal of the amplifier circuitry; and processing circuitry configured to receive an indication of the voltage of the variable supply voltage and an indication of the monitored parameters from the monitoring circuitry and to apply a correction to one or more of the monitored parameters to compensate for coupling between the variable supply voltage and the monitoring circuitry.

20 Claims, 9 Drawing Sheets

(56) References Cited

U.S. PATENT DOCUMENTS

| | | |
|---|---|---|
| 2013/0293299 A1 | 11/2013 | Oh et al. |
| 2017/0040895 A1* | 2/2017 | May .................. H02M 1/08 |
| 2017/0138990 A1* | 5/2017 | Parupalli .............. H03F 1/0205 |
| 2018/0091911 A1 | 3/2018 | Parupalli et al. |
| 2018/0234063 A1* | 8/2018 | King .................. H03F 1/0211 |

OTHER PUBLICATIONS

Combined Search and Examination Report under Sections 17 and 18(3), UKIPO, Application No. GB2200841.1, dated Mar. 10, 2022.

\* cited by examiner

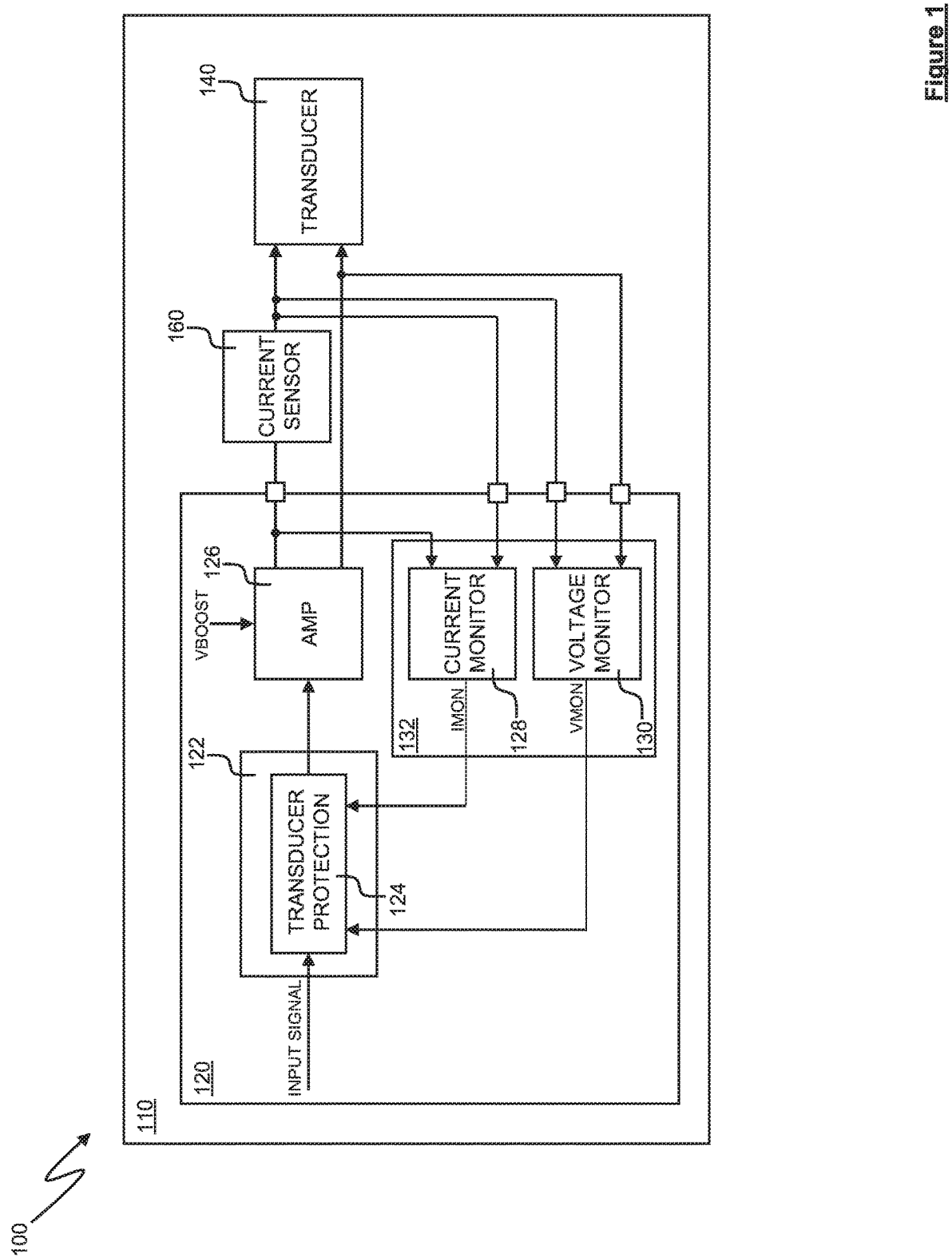

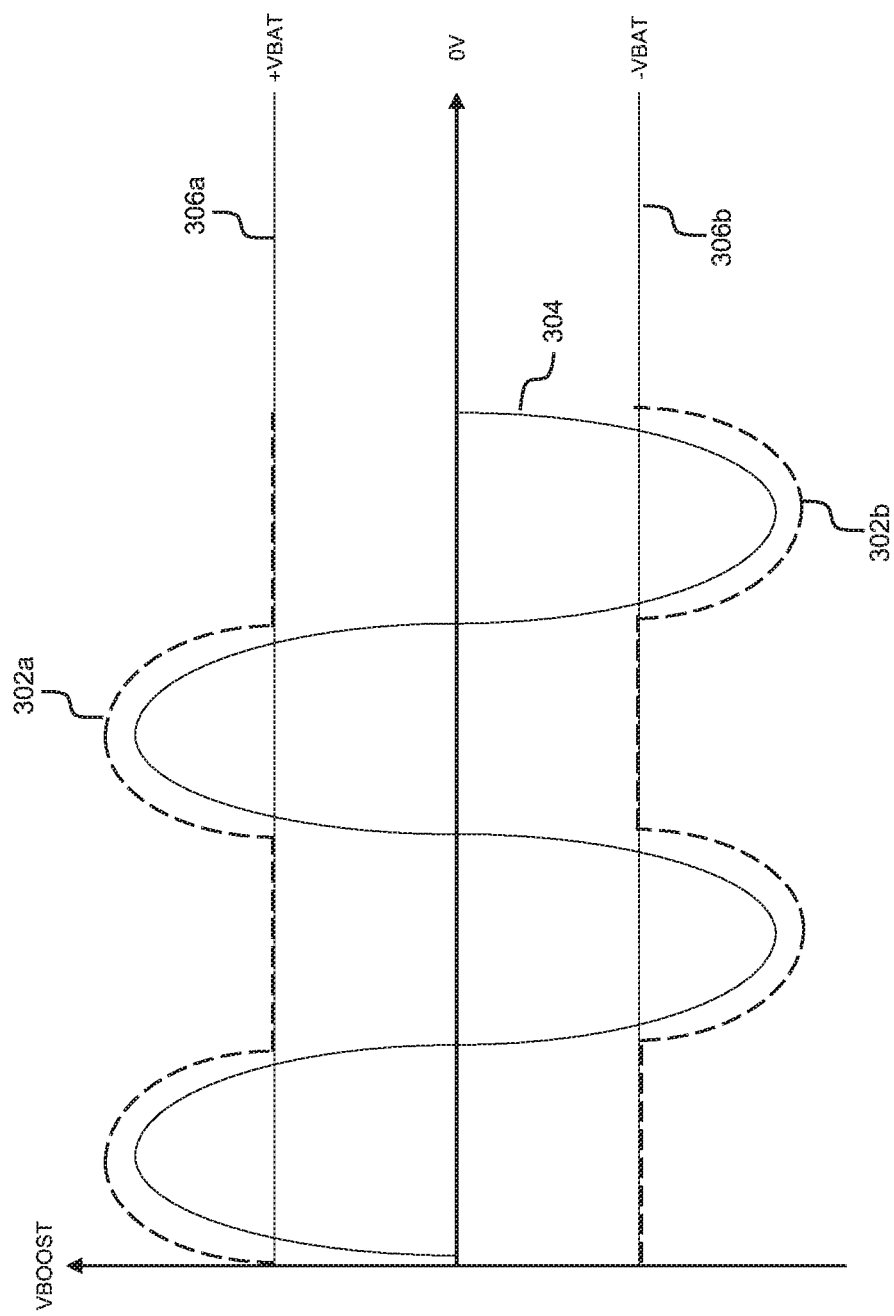

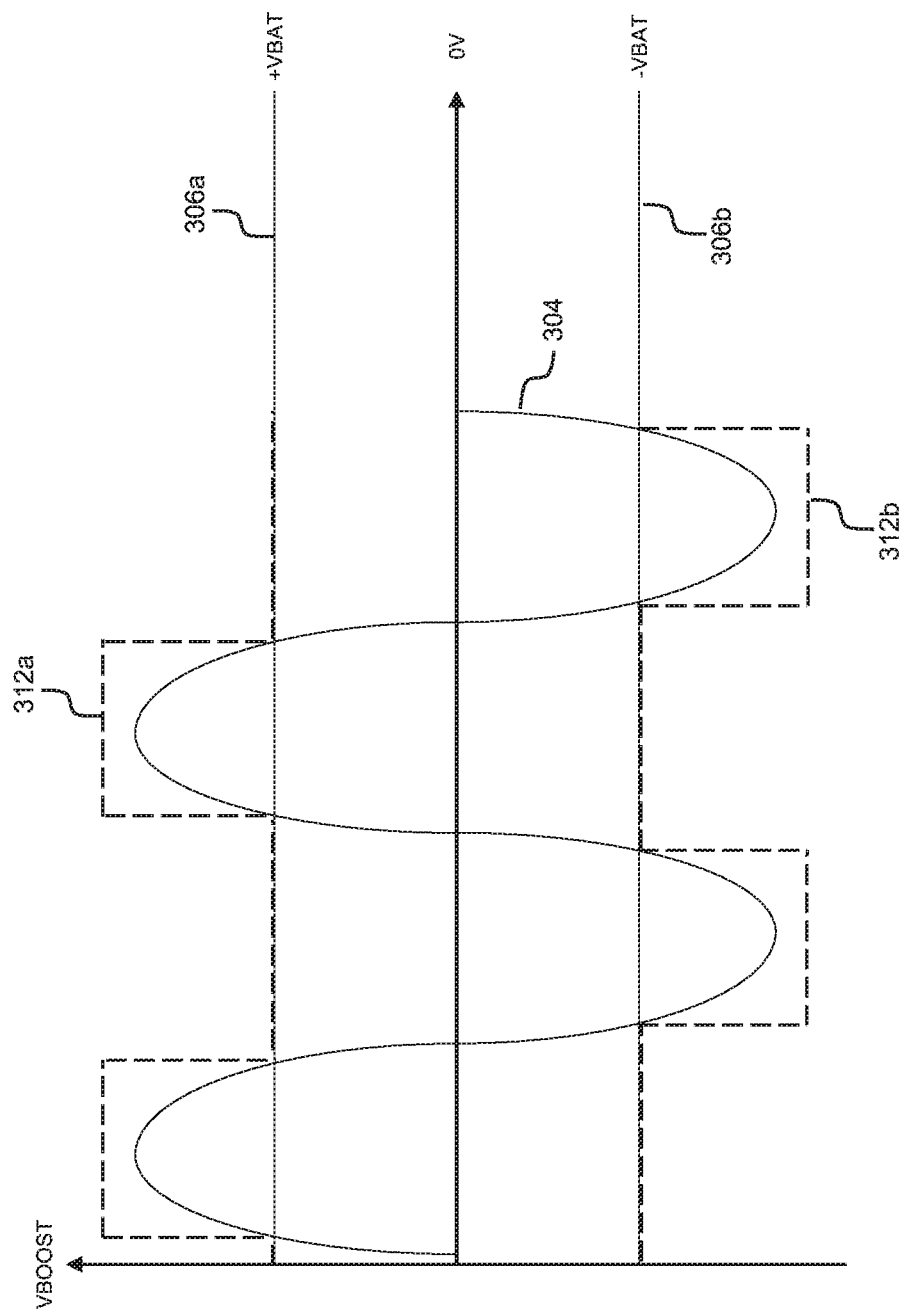

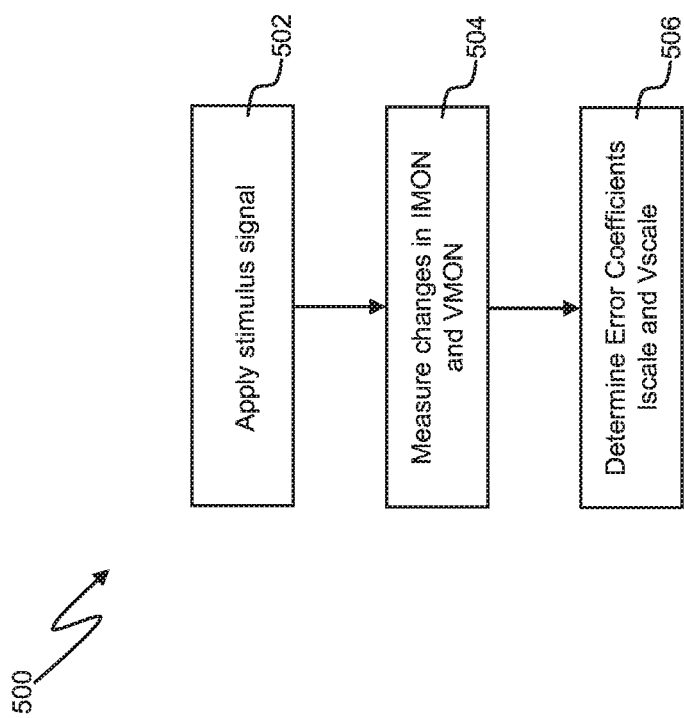

AMPLIFIER SYSTEMS

The present disclosure claims priority to U.S. Provisional Patent Application Ser. No. 62/944,030, filed Dec. 5, 2019, which is incorporated by reference herein in its entirety.

FIELD OF THE INVENTION

The present disclosure relates to the field of amplifier systems, and in particular to amplifier systems for driving loads such as transducers.

BACKGROUND

Transducer driver systems for driving transducers such as speakers, haptic transducers (e.g. resonant actuators, linear or otherwise) and the like typically include amplifier circuitry which receives an input signal and outputs an amplified version of the input signal to drive the transducer.

Such systems may use boost circuitry to provide an increased or boosted supply voltage (i.e. a supply voltage of a magnitude exceeding a nominal supply voltage provided by a system power supply such as a battery) to the amplifier circuitry, to enable the amplifier circuitry to provide a desired range of output signal (voltage or current) magnitudes without requiring a system power supply voltage that can necessarily accommodate such a range of output signal magnitudes.

The boost circuitry may track a level (e.g. an amplitude or envelope) of the input signal and adjust the supply voltage to the amplifier circuitry accordingly, e.g. by increasing the amplifier circuitry supply voltage as the input signal level increases, and decreasing the amplifier circuitry supply voltage as the input signal level decreases. In this way the supply voltage output by the boost circuitry can track the level of the signal output by the amplifier circuitry to ensure that there is always sufficient supply voltage headroom for the amplifier circuitry to accommodate a desired or required output signal magnitude for a given input signal level without clipping, or introducing other distortion into the output signal, thus avoiding the need for excessive headroom in the supply voltage to the amplifier circuitry and thereby improving the power efficiency of the system.

Boosted amplifier circuitry of this kind may be capable of delivering more power, current and/or voltage to the transducer than the transducer can tolerate, particularly for extended periods of time. Thus, to reduce the risk of damaging the transducer, and to optimise the performance of the amplifier circuitry, transducer and/or other elements of the system, signal processing may be used (implemented, for example, in software/firmware or hardware) to monitor the state of the transducer and to modify the output signal of the amplifier circuitry accordingly.

Such signal processing relies on real-time feedback signals such as signals indicative of the voltage and/or current of the output signal output by the amplifier circuitry to the transducer. Such signals can be used, for example, to compute system parameters such as output power and transducer parameters such as the resistance, temperature, excursion and the like of the transducer. The output signal of the amplifier circuitry can be modified based on these computed parameters, for example to avoid damage to the transducer. For example, if the computed output power and/or a computed transducer parameter such as its excursion are indicative of a risk of damage to the transducer, the magnitude of the output signal of the amplifier circuitry can be reduced to a level that would not be damaging to the transducer.

SUMMARY

According to a first aspect, the invention provides circuitry comprising:
- amplifier circuitry configured to receive a variable supply voltage, wherein the supply voltage varies according to an output signal of the amplifier circuitry;
- monitoring circuitry configured to monitor one or more parameters of an output signal of the amplifier circuitry; and
- processing circuitry configured to receive an indication of the voltage of the variable supply voltage and an indication of the monitored parameters from the monitoring circuitry and to apply a correction to one or more of the monitored parameters to compensate for coupling between the variable supply voltage and the monitoring circuitry.

The coupling may arise as a result of parasitic effects and/or as a result of component mismatches in the circuitry, for example.

The amplifier circuitry may be operable as a Class-H or a Class-G amplifier.

The circuitry may further comprise boost converter circuitry configured to receive an input voltage and to output the supply voltage, and the boost circuitry may be configured such that the supply voltage varies according to the output signal of the amplifier circuitry. The circuitry may further comprise an analogue to digital converter (ADC) configured to receive an indication of the voltage of the variable supply voltage and to output a digital indication of the voltage of the variable supply voltage.

The one or more parameters of the output signal may comprise an output voltage or an output current.

The monitoring circuitry may comprise:
- a first analogue to digital converter configured to receive an indication of the output voltage and to output a digital indication of the output voltage; and/or
- a second analogue to digital converter configured to receive an indication of the output current and to output a digital indication of the output current.

The circuitry may be operable to:
- receive a stimulus signal;
- determine a value of the one or more monitored parameters of the output signal at a plurality of known values of the variable supply voltage resulting from the stimulus signal; and
- based on the determined values of the one or more monitored parameters and the plurality of known values of the supply voltage, determine an error coefficient for use in compensating for the coupling between the supply voltage and the monitoring circuitry.

The processing circuitry may be configured to, in use:
- generate a scaled version of the variable supply voltage by scaling the indication of the variable supply voltage by the error coefficient; and
- subtract the scaled version of the variable supply voltage from the indication of the one or more monitored parameters.

The stimulus signal may comprise a step signal, for example.

The circuitry may be further configured to compare the determined error coefficient to a predetermined expected range of error coefficients and to generate an alert the determined error coefficient falls outside of the predetermined expected range.

The circuitry may be configured to drive a load.

The load may comprise a transducer such as an audio transducer or a haptic transducer for example.

The circuitry may implement audio amplifier circuitry for amplifying an input audio signal.

The processing circuitry may be integrated into the amplifier circuitry.

According to a second aspect the invention provides a method for measuring coupling in a system comprising amplifier circuitry having a variable supply voltage that varies according to an output signal of the amplifier circuitry, the method comprising:

applying a stimulus signal to cause the variable supply voltage to adopt one or more known calibration values;

measuring a change in one or more parameters of the output signal of the amplifier circuitry resulting from a change in the variable supply voltage in response to the stimulus signal;

based on the measured change in the one or more parameters of the output signal and the change in the variable supply voltage in response to the stimulus signal, determining an error coefficient; and scaling a value of the variable supply voltage using the determined error coefficient to generate an indication of the coupling.

The one or more parameters of the output signal may comprise an output voltage or an output current.

The stimulus signal may comprise a step signal, for example.

According to a third aspect the invention provides an amplifier system comprising:

amplifier circuitry for driving a load;

boost circuitry for boosting a supply voltage to the amplifier;

monitoring circuitry for monitoring a load signal driving the load; and control circuitry for determining a level of coupling between the boost circuitry and the monitoring circuitry and applying a correction to the monitored load signal.

According to a fourth aspect the invention provides integrated circuitry comprising the amplifier system according to the first or third aspect.

According to a fifth aspect the invention provides a device comprising the amplifier system according to first or third aspect, wherein the device comprises a mobile telephone, a tablet or laptop computer, a portable media player, a gaming device, a wearable device or an accessory device.

According to a sixth aspect the invention provides an amplifier system comprising:

an amplifier for driving an electromagnetic load;

a boost circuit for boosting a supply voltage to the amplifier;

a monitoring circuit for monitoring a load signal driving the load; and a controller for determining the level of electrical coupling between the boost circuit and the monitoring circuit and applying a correction to the monitored load signal based upon the determined level of coupling.

The controller may be configured to apply a stimulus signal to the boost circuit to monitor a change in the monitored signals in response to the application of the stimulus signal.

The stimulus signal may be a step signal, for example.

The controller may be configured to generate a calibration code or coefficient to be applied to a signal path of the monitored signals, to compensate for the coupling with the boost circuit.

The controller may be arranged to compare the required correction to an allowable range of correction values, wherein if the required correction is outside of the allowable range the controller is configured to generate a system warning.

The system warning may be an indication of a problem with the amplifier system, such that the system should be investigated and repaired, or rejected.

According to a seventh aspect the invention provides a method of controlling an amplifier system having a voltage and/or current monitoring system, the method comprising the steps of:

monitoring a voltage monitor signal (VMON) and/or a current monitor signal (IMON) of an electromagnetic load when driven by a signal from an amplifier;

determining a level of electrical coupling between an amplifier boost circuit and the voltage monitor (VMON) and/or current monitor (IMON) signals; and applying a correction to the voltage monitor (VMON) and/or current monitor (IMON) signals based on the determined level of coupling.

According to an eighth aspect the invention provides a controller arranged to implement the steps of the method of the seventh aspect.

According to a ninth aspect the invention provides a non-transitory computer-readable storage medium having computer-executable instructions stored thereon that, when executed by processor circuitry, cause the processor circuitry to perform a method comprising:

monitoring a voltage monitor signal (VMON) and/or a current monitor signal (IMON) of an electromagnetic load when driven by a signal from an amplifier;

determining a level of electrical coupling between an amplifier boost circuit and the voltage monitor (VMON) and/or current monitor (IMON) signals; and applying a correction to the voltage monitor (VMON) and/or current monitor (IMON) signals based on the determined level of coupling.

According to a tenth aspect the invention provides a non-transitory computer-readable storage medium having computer-executable instructions stored thereon that, when executed by processor circuitry, cause the processor circuitry to perform a method comprising:

applying a stimulus signal to a controller of a voltage booster such that the output voltage of the voltage booster changes to a predetermined set of calibration values;

measuring respective changes in monitored voltage and current signals;

generating calibration codes that can be applied in the signal paths of the monitored signals to compensate for coupling from a voltage booster;

scaling the boost voltage by the calibration codes and subtracting the scaled boost voltage from the monitored signals; and cancelling coupled artefact signals from the monitored signals in real-time.

BRIEF DESCRIPTION OF THE DRAWINGS

Embodiments of the invention will now be described, strictly by way of example only, with reference to the accompanying drawings, of which:

FIG. 1 is a schematic diagram illustrating a transducer driver system that includes a transducer protection subsystem;

FIG. 3a is an illustration of a boosted supply voltage for amplifier circuitry tracking an output voltage of the amplifier circuitry;

FIG. 3b is an illustration of a boosted supply voltage for amplifier circuitry varying according to an output voltage of the amplifier circuitry;

FIG. 5 is a flow diagram illustrating steps in a method for determining error coefficients for use by the circuitry of FIG. 4;

DETAILED DESCRIPTION

Figure 2A:
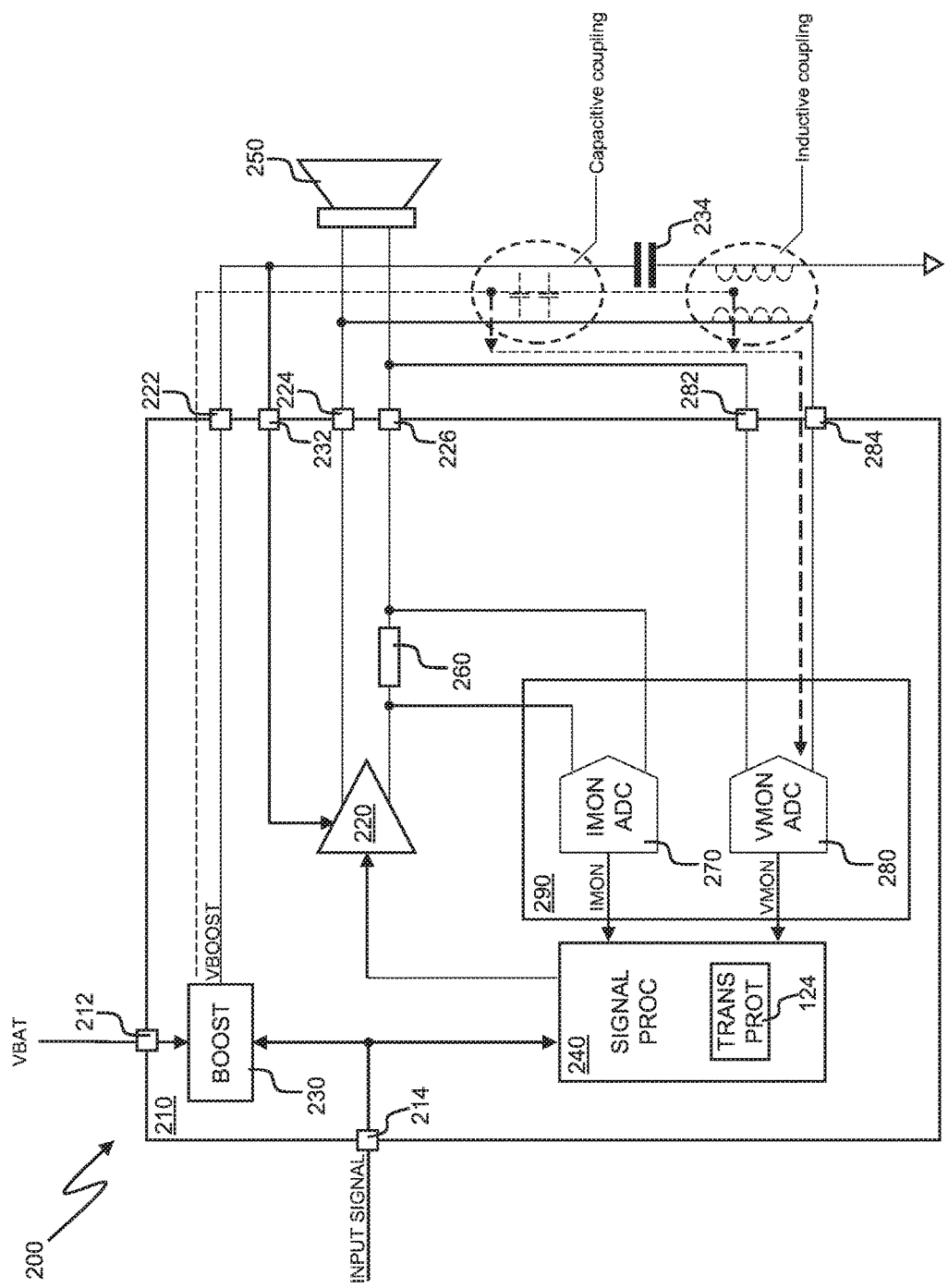
FIG. 2a is a schematic diagram illustrating capacitive and inductive coupling between a boosted power supply and voltage and current monitoring signal paths in boosted amplifier circuitry.

Referring first to FIG. 1, a transducer driver system is shown generally at 100. The system 100 includes a carrier or substrate 110 such as a printed circuit board (PCB) on which is mounted an integrated circuit (IC) 120 which may be, for example, an audio amplifier or audio codec.

The system 100 also includes an output transducer 140, which may be an audio output transducer such as a speaker, a haptic output transducer such as a linear resonant actuator (LRA), or some other output transducer that converts the energy of an electrical signal output by the IC 120 into another form of energy.

The system 100 further includes a current sensor 160, coupled between an output of the IC 120 and an input of the output transducer 140 and operative to provide a signal indicative of a current in a signal path between an output of the IC 120 and an input of the transducer 140, and therefore indicative of a current through the transducer 140. The current sensor 160 may be a current sense resistance of known value, for example.

The IC 120 includes signal processing circuitry 122, which may be digital signal processing (DSP) circuitry, for example. The signal processing circuitry 122 is operative to receive an input signal (e.g. an audio input signal) and to output a processed or adjusted version of the input signal to amplifier circuitry 126 of the IC 120.

The signal processing circuitry 122 includes a transducer protection subsystem 124, which may be implemented in circuitry and/or in firmware and/or software that is executed by the signal processing circuitry 122. The transducer protection subsystem 124 is operative to receive one or more real-time feedback signals indicative of one or more parameters of the system 100 and to process or adjust the input signal based on the received feedback signals, as will be described in more detail below.

The amplifier circuitry 126 is operative to receive the processed or altered version of the input signal from the signal processing circuitry 122 and to output an output signal representing amplified version of the input signal to the transducer 140. In the illustrated example the amplifier circuitry 126 is differential amplifier circuitry having differential outputs that output a differential output signal, but it will be appreciated by those of ordinary skill in the art that single-ended amplifier circuitry 126 having a single-ended output. The amplifier circuitry 126 may receive a supply voltage VBOOST from a boosted power supply subsystem (not shown) of a host device that incorporates the system 100. The boosted power supply subsystem may adjust the supply voltage VBOOST based on a level (e.g. amplitude or envelope) of the input signal such that the supply voltage VBOOST tracks the level of the differential output signal of the amplifier circuitry 126, so as to ensure that there is sufficient supply voltage headroom for the amplifier circuitry 126 to accommodate a desired or required output signal magnitude for a given input signal level without clipping or causing other distortion in the output signal.

The IC 120 also includes current monitoring circuitry 128. A first input of the current monitoring circuitry 128 is coupled to an output of the amplifier circuitry 126, and a second input of the current monitoring circuitry 128 is coupled to an output of the current sensor 160. An output of the current monitoring circuitry 128 is coupled to the transducer protection subsystem 124 of the signal processing circuitry 122. The current monitoring circuitry 128 is operative to generate and output a monitored current signal IMON indicative of instantaneous current in the signal path from the output of the amplifier circuitry 126 to the input of the transducer 140.

In one example, in which the current sensor 160 is a current sense resistor of known value, a voltage drop across the current sense resistor is indicative of the instantaneous current through the current sense resistor and thus in the signal path from the amplifier circuitry 126 to the transducer 140. In this example the current monitoring circuitry 128 includes a differential current sense amplifier (not illustrated) which amplifies the voltage drop across the current sense resistor to generate the output signal IMON.

The IC 120 also includes voltage monitoring circuitry 130. First and second inputs of the voltage monitoring circuitry 130 are coupled to respective first and second inputs of the transducer 140. An output of the voltage monitoring circuitry 130 is coupled to the transducer protection subsystem 124 of the signal processing circuitry 122. Thus the voltage monitoring circuitry receives an indication of a differential input voltage to the transducer 140, and generates and outputs a monitored voltage signal VMON indicative of an instantaneous voltage across the transducer 140.

The current monitoring circuitry 128 and the voltage monitoring circuitry 130 may be referred to collectively as monitoring circuitry 132.

The transducer protection subsystem 124 receives the signals VMON and IMON and processes them to determine parameters of the system 100 and/or of the transducer 140, such as the output power, transducer resistance, excursion, temperature and the like. Based on the received signals VMON and IMON and/or the determined parameters the transducer protection subsystem 124 may determine whether the prevailing operating conditions (e.g. output signal voltage and/or current) may be damaging to the transducer 140. If so, the transducer protection subsystem 124 may take appropriate action, such as outputting a control signal to cause the processing circuitry 122 to attenuate the input signal or otherwise limit the amplitude of the processed version of the input signal that is output to the amplifier circuitry 124, to ensure that the amplified signal output by the amplifier circuitry 124 is at a level that will not cause damage to the transducer 124.

One issue that can arise in systems of the kind described above and illustrated in FIG. 1 is that electrical and/or electromagnetic coupling between the boosted supply voltage VBOOST and the signal path carrying the monitored voltage signal VMON and/or the signal path carrying the monitored current signal IMON can lead to inaccuracies in the determination of the parameters of the transducer (e.g. transducer resistance, excursion, temperature etc.). This is because accurate determination of such parameters is dependent upon the signals VMON and IMON being an accurate reflection of the voltage across the transducer 140 and the current through the transducer 140.

Electrical and/or electromagnetic coupling between the boosted supply voltage VBOOST and the signals VMON and IMON introduces error or distortion into the signals VMON and IMON, which reduces their accuracy and thus leads to inaccurate determination of transducer parameters. This can in turn lead to inadequate protection for the transducer 140, in the sense that output signals with potentially damaging current and/or voltage levels could be output by the amplifier circuitry 126 due to no or insufficient attenuation of the input signal by the signal processing circuitry 122 following an incorrect determination of the relevant transducer parameter by the transducer protection subsystem 124.

Figure 2B:
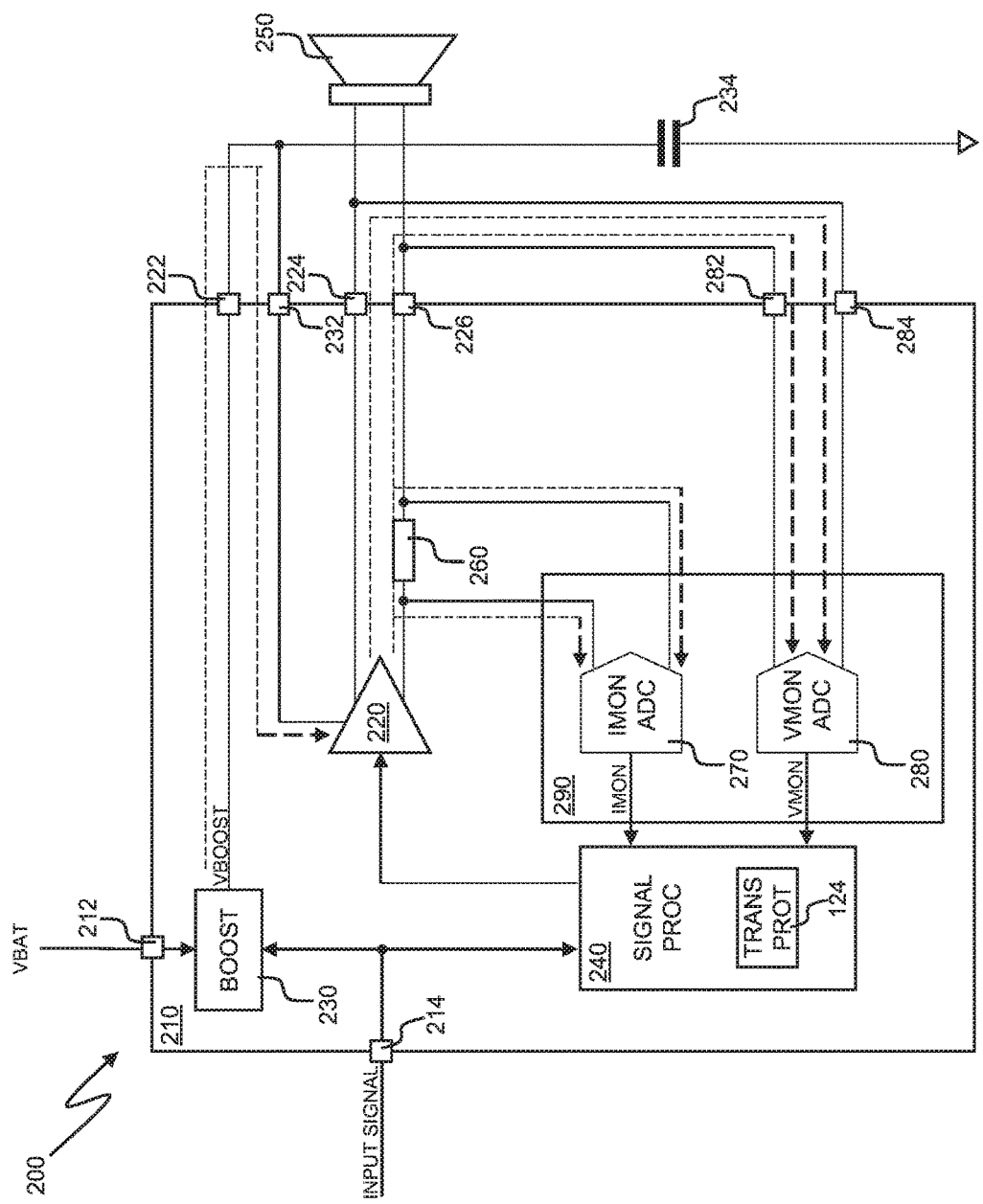
FIG. 2b is a schematic diagram illustrating electrical coupling between a boosted power supply and voltage and current monitoring signal paths in boosted amplifier circuitry.

FIGS. 2a and 2b illustrate examples of coupling between a boosted supply voltage VBOOST and voltage and current monitor signals VMON and IMON in an amplifier system 200. FIG. 2a illustrates some of the sources of coupling that may arise in the amplifier system 200 between a supply voltage rail that provides the boosted supply voltage VBOOST and the signal paths associated with capturing the VMON and IMON signals as a result of parasitic sources in and/or around a substrate or carrier such as a printed circuit board to which the IC 210 and/or transducer 250 are connected or in which the IC 210 and/or transducer 250 operate.

Thus, FIG. 2a shows an amplifier system 200 including an IC 210 which includes boosted amplifier circuitry 220, boost converter circuitry 230 and signal processing circuitry 240.

The boost converter circuitry 230 receives a supply voltage VBAT from a source such as an on-board battery of a host device in which the IC 210 is incorporated (e.g. via a power supply terminal, e.g. a pin, pad, ball or the like 212 of the IC 210), and outputs a supply voltage VBOOST to the amplifier circuitry 220. In the example illustrated in FIG. 2a, an output of the boost converter circuitry 230 is coupled to a boosted voltage output terminal 222 of the IC 210, and a supply voltage input of the amplifier circuitry 220 is coupled to an amplifier power supply terminal 232 of the IC 210, with the boosted voltage output terminal 222 and the amplifier power supply terminal 232 being coupled externally of the IC 210 (e.g. by conductive tracks of a PCB on which the IC 210 is mounted). A decoupling capacitor 234 is also provided, externally of the IC 210, coupled between the boosted voltage output terminal 222 and/or the amplifier power supply terminal 232 and ground. However, in other examples a direct (i.e. on-chip) connection between the output of the boost converter circuitry 230 and the supply voltage terminal 232 of the amplifier circuitry 220 may be provided. In this "on chip" example a decoupling capacitor 234 is also provided, externally of the IC 210, coupled between the boosted voltage output terminal 232 and ground. The "on chip" example has the advantage that one extra terminal (222) is not required on the IC 210.

The signal processing circuitry 240 is configured to receive an input signal such as an audio signal, e.g. via an input terminal 214 of the IC 210, so as to process the input signal as required, and to output a processed version of the input signal to the amplifier circuitry 220.

The amplifier circuitry 220 is configured to receive the processed signal output by the signal processing circuitry 240, and to output an amplified output signal to a transducer 250, external to the IC 210, that is coupled to output terminals 224, 226 of the IC 210. In the illustrated example the transducer 250 is a speaker, but it will be appreciated that the transducer 250 could be some other transducer such as a haptic transducer, e.g. a linear resonant actuator.

The boost converter circuitry 230 is configured to receive an indication of a level (e.g. an amplitude or an envelope) of the input signal and to adjust the supply voltage VBOOST that is output to the amplifier circuitry 220, such that the supply voltage VBOOST varies according to a level of the amplified output signal that is output by the amplifier circuitry 220, thereby ensuring that the amplifier circuitry 220 is able to accommodate a desired or required output signal magnitude for a given input signal level without clipping or introducing other distortion into the output signal.

For example, the boost converter circuitry 230 may be configured such that the supply voltage VBOOST tracks the level of the output signal output by the amplifier circuitry 220 Thus, the amplifier circuitry 220 may be operable as a variable supply voltage amplifier such as a Class-H amplifier, for example.

Alternatively, the amplifier circuitry 220 may be operable as a variable supply voltage Class-G amplifier. Such variable supply voltage amplifiers may be advantageously used when the boost converter circuitry 230 adjusts the supply voltage VBOOST so as to provide sufficient supply voltage headroom to the amplifier circuitry 220 to accommodate a desired or required output signal magnitude based on a given input signal level without clipping or resulting in other distortion in the output signal.

The IC 210 further includes a current sensor 260, which may be, for example, a current sense resistance of known value, positioned somewhere in a signal path between the amplifier circuitry 220 and the transducer 250. A current monitor analogue-to-digital converter (ADC) 270 is coupled to the current sensor 260 and is operative to convert an analogue signal (e.g. an analogue differential voltage signal indicative of a voltage drop across the current sensor 260) into a digital current monitor signal IMON indicative of the instantaneous current in the signal path between the amplifier circuitry 220 and the transducer 250 (and therefore of the instantaneous current through the transducer 250).

The IC 210 further includes a voltage monitor ADC 280, which is configured to receive an analogue signal indicative of an output voltage of the amplifier circuitry 220 (e.g. a differential voltage in this example) and to convert the received analogue signal into a digital voltage monitor signal VMON. In the example illustrated in FIG. 2a differential inputs of the voltage monitor ADC are coupled to voltage monitor input terminals 282, 284 of the IC 210, and the voltage monitor input terminals 282, 284 are coupled to the output terminals 224, 226 externally of the IC 210. However, in other examples a direct (i.e. on-chip) connection between the outputs of the amplifier circuitry 220 and the inputs of the voltage monitor ADC 280 may be provided.

The current monitor ADC 270 and the voltage monitor ADC 280 may be collectively referred to as monitoring circuitry 290.

As discussed above, the boost converter circuitry 230 is configured to output a supply voltage VBOOST for the amplifier circuitry 220 that varies according to or in response to the output signal of the amplifier circuitry 220, particularly when the magnitude of the output signal of the amplifier circuitry 220 exceeds the supply voltage VBAT received by the IC 210.

An example of a varying supply voltage in a Class-H amplifier arrangement is illustrated in FIG. 3a, which shows positive and negative components of the supply voltage VBOOST 302a, 302b (in dashed outline) to the amplifier circuitry 220 tracking the amplitude of the output signal 304 (in solid line) of the amplifier circuitry 220 when the amplitude of the output signal 304 exceeds the positive and negative IC supply voltages+VBAT 306a and −VBAT 306b (dotted line).

An example of a varying supply voltage in a Class-G amplifier arrangement is illustrated in FIG. 3b, which shows the level of positive and negative components of the supply voltage VBOOST 312a, 312b (in dashed outline) to the amplifier circuitry 220 varying in response to the amplitude of the output signal 304 (in solid line) of the amplifier circuitry 220 when the amplitude of the output signal 304 exceeds the positive and negative IC supply voltages+VBAT 306a and −VBAT 306b (dotted line).

Thus the supply voltage VBOOST to the amplifier circuitry 220 is modulated by the output signal of the amplifier circuitry 220.

As indicated by the dashed arrows in FIG. 2a, capacitive and/or inductive coupling may occur, for example, between conductive tracks on a substrate such as a PCB of the system, such as a track that carries the boosted supply voltage VBOOST and a track that couples the audio output terminal 224 to the voltage monitor input terminal 284, and inductive coupling may also occur through vias in the PCB. Such coupling can lead to a portion of the modulated boosted variable supply voltage VBOOST appearing in the signal path to the voltage monitoring ADC 280, and consequent distortion or error in the signal VMON output by the voltage monitoring ADC 280.

In addition to the capacitive and/or inductive coupling that may occur in the system 200, a degree of electrical coupling between the boosted supply voltage VBOOST and the signals VMON and IMON may also arise, largely as a result of a finite or limited common mode rejection ratio (CMRR) in signal paths for the voltage and current monitoring signals VMON and IMON. This finite or limited CMRR may result from component mismatches in components that are present in an IC, for example transistors that are used in the amplifier circuitry 220 and/or the current monitoring ADC 270 and/or the voltage monitoring ADC 280.

FIG. 2b illustrates an example of the effect of such electrical coupling between the boosted supply voltage VBOOST and the signals VMON and IMON.

As a result of the modulation of the supply voltage VBOOST by the output signal of the amplifier circuitry 220, a common mode signal may be present in the differential output signal of the amplifier circuitry 220. Because of the finite or limited CMRR of the signal paths between the outputs of the amplifier circuitry 220 and the inputs of the current monitoring ADC 270 and the voltage monitoring ADC 280 (which may arise as a result of component mismatch in the IC 210, for example), a portion of this common mode signal appears in the signals VMON and IMON. This is shown by the dashed arrows in FIG. 2a. As discussed above, this distortion or error in the signals VMON and IMON can lead to inaccurate computation of parameters such as the transducer resistance, excursion and temperature, since the computation of those parameters relies on accurate VMON and IMON signals.

As indicated by the dashed arrows in FIG. 2b, capacitive and/or inductive coupling may occur between conductive tracks on a substrate such as a PCB of the system, such as a track that carries the boosted supply voltage VBOOST and a track that couples the audio output terminal 224 to the voltage monitor input terminal 284, and inductive coupling may also occur through vias in the PCB. Such coupling can lead to a portion of the boosted supply voltage VBOOST appearing in the signal path to the voltage monitoring ADC 280, and consequent distortion or error in the signal VMON output by the voltage monitoring ADC 280.

The present disclosure provides a mechanism that compensates for or cancels distortion or error in the signals VMON and IMON to facilitate accurate computation of parameters such as transducer resistance, temperature, excursion and the like.

Figure 4:
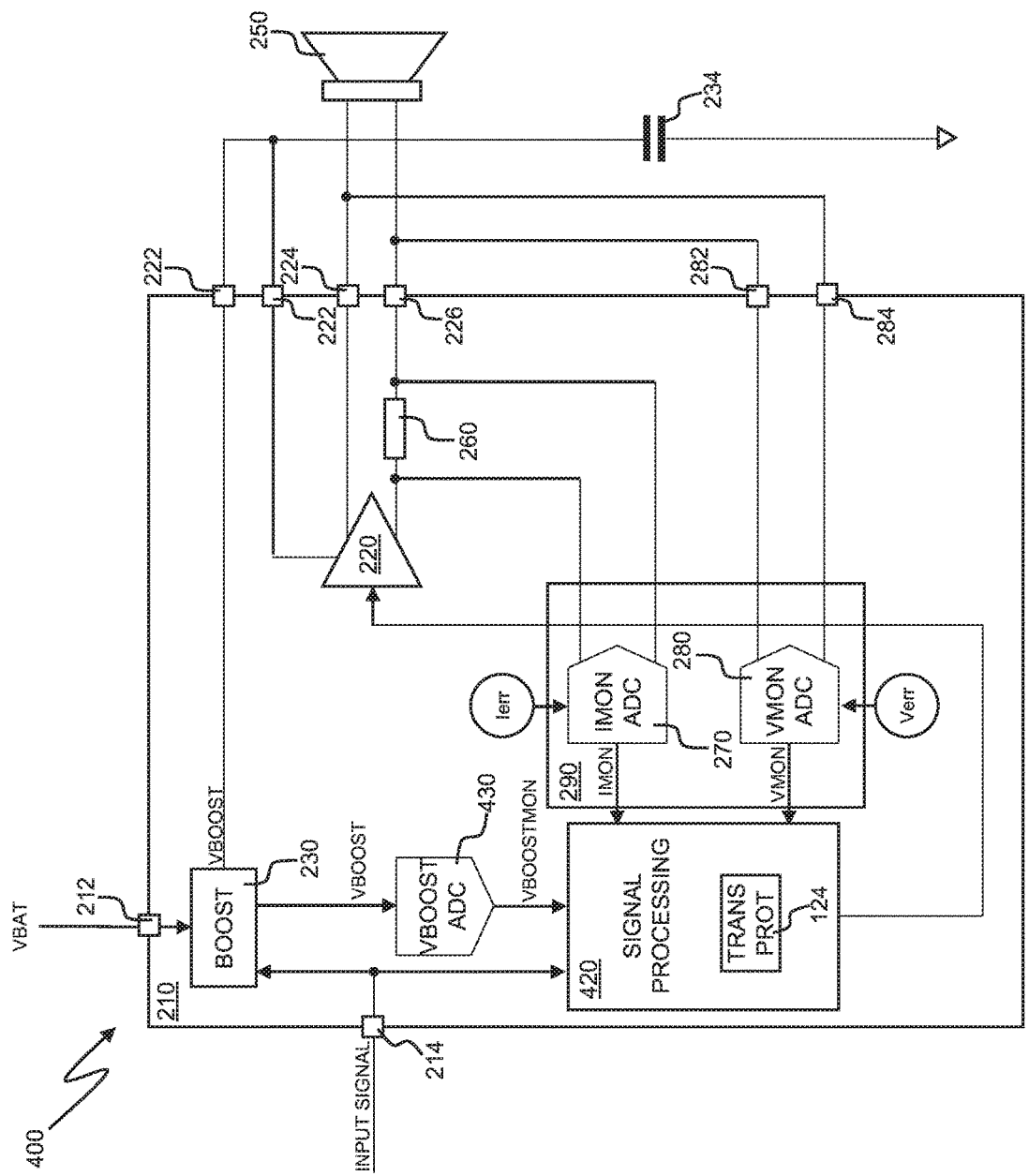
FIG. 4 is a schematic diagram illustrating part of an amplifier system according to the present disclosure.

FIG. 4 is a schematic representation of part of an amplifier system according to an embodiment of the present disclosure.

The amplifier system, shown generally at 400 in FIG. 4, is similar to the amplifier system 200 illustrated in FIGS. 2a and 2b, and has many elements in common with the amplifier system 200. Such common elements are denoted by common reference numerals, and are configured and operative as described above with reference to FIGS. 2a and 2b. For the sake of conciseness such common elements will not be described again in detail here.

In the amplifier system 400 of FIG. 4 the IC 210 includes signal processing or control circuitry 420 that is configured to receive the input signal and to output a processed or modified version of the input signal to the amplifier circuitry 220. In the system 400 illustrated in FIG. 4 the signal processing or control circuitry 420 is shown as being integrated with the amplifier circuitry 220 on the same IC. It is to be understood, however, that the signal processing or control circuitry 420 may be provided separately to the amplifier circuitry 220, e.g. in a separate DSP (digital signal processor) IC.

The IC 210 also includes a supply voltage VBOOST monitoring ADC 430, which is operative to receive the analogue supply voltage VBOOST output by the boost converter circuitry 230, or an indication thereof, and to output a digital signal VBOOSTMON indicative of an instantaneous magnitude of the supply voltage VBOOST output by the boost converter circuitry 230 to the signal processing or control circuitry 420.

The signal processing or control circuitry 420 is further configured to receive the current and voltage monitoring signals IMON, VMON output by the current monitoring ADC 270 and the voltage monitoring ADC 280 respectively.

The portion of the common mode signal that appears in the IMON signal due to electrical coupling between the supply voltage VBOOST and the signal paths to the current monitoring ADC 270 and/or capacitive/inductive coupling arising due to parasitic effects and/or component mismatch can be considered to be a current error term Ierr. Similarly, the portion of the common mode signal that appears in the VMON signal due to electrical coupling between the supply voltage VBOOST and the signal paths to the voltage monitoring ADC 280 and/or capacitive/inductive coupling arising due to parasitic effects and/or component mismatch can be considered to be a voltage error term Verr.

Thus, the signal IMON can be modelled as:

$IMON = ILOAD + Ierr$, where $ILOAD$ is an actual instantaneous current through the transducer 250.

Similarly, the signal VMON can be modelled as:

$VMON = VLOAD + Verr$, where $VLOAD$ is an actual instantaneous voltage across the transducer 250.

The current and voltage error signals Ierr and Verr have a linear relationship with the boosted supply voltage VBOOST, to a first order approximation, and thus can be modelled as:

$Ierr = VBOOST \cdot Iscale$; and $Verr = VBOOST \cdot Vscale$, where $Iscale$ and $Vscale$ are error coefficients.

The system 400 is operative to determine the error coefficients Iscale and Vscale during an initial calibration of the system 400 and subsequently to apply the determined error coefficients during operation of the system 400 so as to dynamically compensate for or cancel any coupling (electrical and/or capacitive/inductive) of the supply voltage VBOOST into the VMON and IMON signal paths, as well as any component mismatch, as will now be described with reference to FIG. 5.

FIG. 5 is a flow diagram illustrating steps performed in a process to determine the error coefficients Iscale and Vscale. The process 500 is performed when the system 400 has been assembled and all the relevant connections between components have been made (e.g. when all of the components are connected together on a carrier, substrate or the like, which may be referred to as a "motherboard") to ensure that all parasitic effects or components and/or other sources of coupling and/or error are accounted for in the calibration and determination of the current and voltage error coefficients. For example, the calibration process 500 may be performed as part of an end of production line test routine. The calibration process 500 may also be performed occasionally or periodically by the system 400 after it has been installed in a host device. For example, the calibration process 500 may be performed on start-up of the host device.

In a first step 502, a stimulus signal is applied to the system 400 (e.g. to the boost converter circuitry 230) to cause the output voltage VBOOST of the boost converter circuitry 230 to adopt one or more known calibration values. The stimulus signal may be, for example, a step signal that steps between a first DC magnitude (e.g. 0V) and a second DC magnitude. Alternatively, the stimulus signal may be a time-varying signal such as a sinusoid.

In a second step 504, changes in the current monitoring signal IMON and the voltage monitoring signal VMON resulting from the changing voltage VBOOST that arise as a result of the applied stimulus signal are measured, e.g. by the signal processing or control circuitry 420.

Figure 6A:
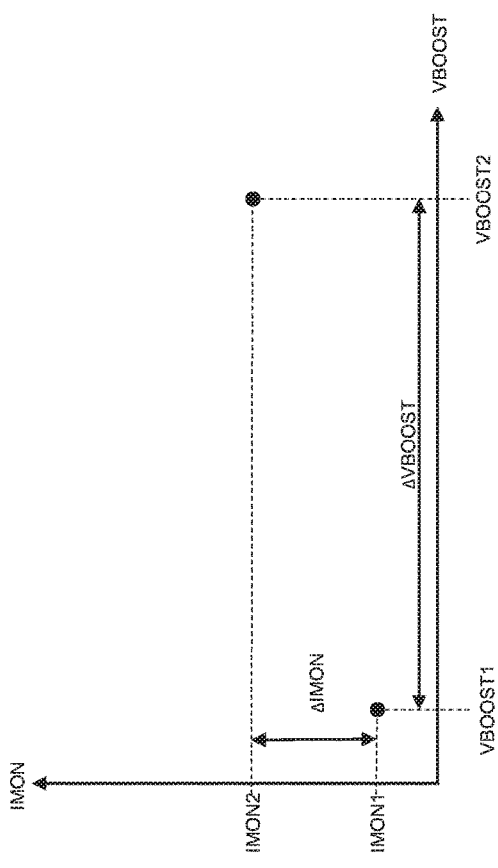
FIGS. 6a and 6b illustrate the calculation of voltage and current differences for different boosted supply voltage levels in the circuitry of FIG. 4.

For example, as shown in FIG. 6a, at a first instantaneous VBOOST magnitude VBOOST1, the instantaneous value of the signal IMON is IMON1, whereas at a second instantaneous VBOOST magnitude VBOOST2, the instantaneous value of the signal IMON is IMON2. Thus a difference or change ΔVMON between the value of IMON at VBOOST2 and the value of IMON at VBOOST1 can be expressed as ΔVMON=IMON2−IMON1. The value ΔVMON can be calculated by the signal processing circuitry 420, for example.

Figure 6B:
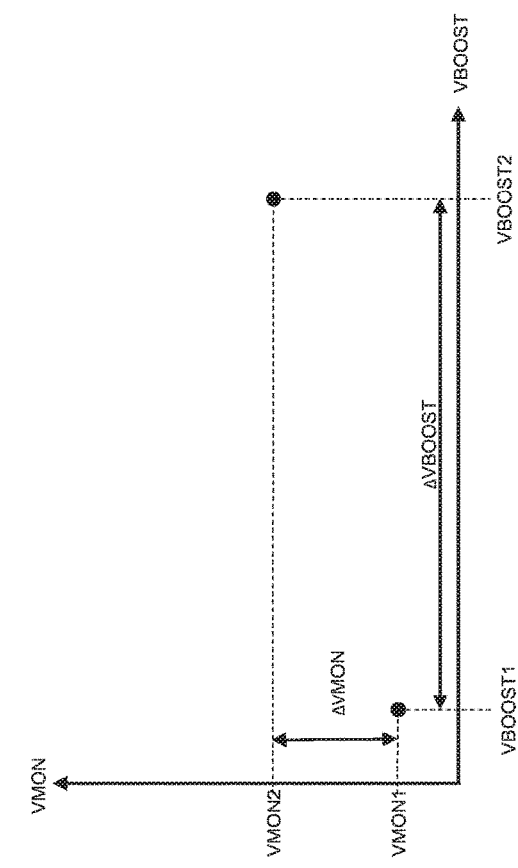

Similarly, as shown in FIG. 6b, at a first instantaneous VBOOST magnitude VBOOST1, the instantaneous value of the signal VMON is VMON1, whereas at a second instantaneous VBOOST magnitude VBOOST2, the instantaneous value of the signal VMON is VMON2. Thus a difference or change ΔVMON between the value of VMON at VBOOST2 and the value of VMON at VBOOST1 can be expressed as ΔVMON=VMON2−VMON1. The value ΔVMON can be calculated by the signal processing circuitry 420, for example. The change in the instantaneous value of VBOOST between VBOOST2 and VBOOST1 can also be calculated by the signal processing circuitry 420, as ΔVBOOST=VBOOST2−VBOOST1.

In a final step 506, the error coefficients Iscale and Vscale are generated by the signal processing or controller circuitry 420 as follows:

$Iscale = \Delta VMON / \Delta VBOOST$ $Vscale = \Delta VMON / \Delta VBOOST$

The generated error coefficients Iscale and Vscale can subsequently be used by the signal processing circuitry 420 to compensate for any error or distortion in the current and voltage monitoring signals IMON, VMON that are generated during use of the system 400. The generated error coefficients Iscale and Vscale can be applied to the current and voltage monitoring signals IMON, VMON respectively to generate scaled versions of the IMON and VMON signals, which are indications of the level of common mode coupling in the IMON and VMON signals respectively. These scaled versions of the current and voltage monitoring signals (i.e. the indications of the level of common mode coupling in the IMON and VMON signals respectively) can then be from the IMON and VMON signals respectively, i.e.:

$IMONSCALED = Iscale \cdot IMON$;

$VMONSCALED = VScale \cdot VMON$;

$IMONTRUE = IMON - IMONSCALED$, where $IMONTRUE$ is a signal indicative of the actual instantaneous current through the transducer 250; and $VMONTRUE = VMON - VMONSCALED$, where $VMONTRUE$ is a signal indicative of the actual instantaneous voltage across the transducer 250.

Thus the system 400 is able to remove, cancel or compensate for any and all coupling artefacts from all sources (e.g. electrical coupling and/or capacitive/inductive coupling and/or component mismatches) in real-time, such that the monitored voltage and current signals that are received by the signal processing circuitry 420 provide an accurate of indication the current through the transducer 250 and the voltage across the transducer 250, and thus can be used to generate accurate measurements of transducer parameters such as transducer resistance, temperature and excursion and system parameters such as output power.

As will be appreciated by those of ordinary skill in the art, it is desirable that the coefficients Iscale and Vscale are accurate. If the coefficients Iscale and Vscale are inaccurate then the calculation of IMONTRUE and VMONTRUE will also be inaccurate, which could result in poor performance or even damage to a transducer 250, if the processing performed by the signal processing circuitry 420 is insufficient to prevent damaging output voltage and/or current levels from being output by the amplifier circuitry due to inaccuracies in the coefficients Iscale and Vscale.

By determining a possible range of variation in ICs 210 and/or systems 400 it is possible for the calibration process or routine to perform self-checking. By measuring a plurality of representative systems 400 it is possible to establish the standard deviation of the variation of the coefficients Vscale and Iscale for an uncalibrated system 400. From this it is possible to calculate an expected or allowable range for each of the coefficients Vscale, Iscale. During the calibration process 500 (e.g. during end of production line testing), the calculated coefficient Vscale can be compared to the expected or allowable range for Vscale and/or the calculated coefficient Iscale can be compared to the expected or allowable range for Iscale for each system 400 under test. Any system 400 for which one or both of the coefficients Vscale and Iscale falls outside of the expected or allowable range can be rejected. Additionally, or alternatively, if either or both of the calculated coefficients fall outside of the expected or allowable range the system 400, or a test system that is testing the system 400, can generate an alert or warning. The alert or warning may be an indication of a problem with the system 400 and may prompt an operator of the test system to investigate and repair the problem, or to reject the system 400.

Additionally, the expected range of coefficients Vscale and Iscale can be stored locally (e.g. in a memory of the system 400 or a memory of a host device incorporating the system 400) for use when the system 400 performs the calibration process 500, e.g. on start-up of a host device. Thus the system 400 (e.g. signal processing circuitry 420) or the host device may compare one or both of the coefficients Vscale, Iscale calculated by the system 400 during the calibration process 500. If either or both of the calculated coefficients fall outside of the expected or allowable range the system 400 can generate an alert or warning that can be output by the host device, e.g. by displaying an error message, outputting an error tone or the like. The alert or warning may be an indication of a problem with the system 400 and may prompt a user of the system 400 (or the host device) to investigate and repair the problem, or to reject the system 400 or the host device.

The system 400 may be incorporated in a host device such as a mobile telephone, a tablet or laptop computer, portable media player, a gaming device, a wearable device or the like, or an accessory device (e.g. headphones, earphones, earbuds, a headset etc.).

Figure 7:
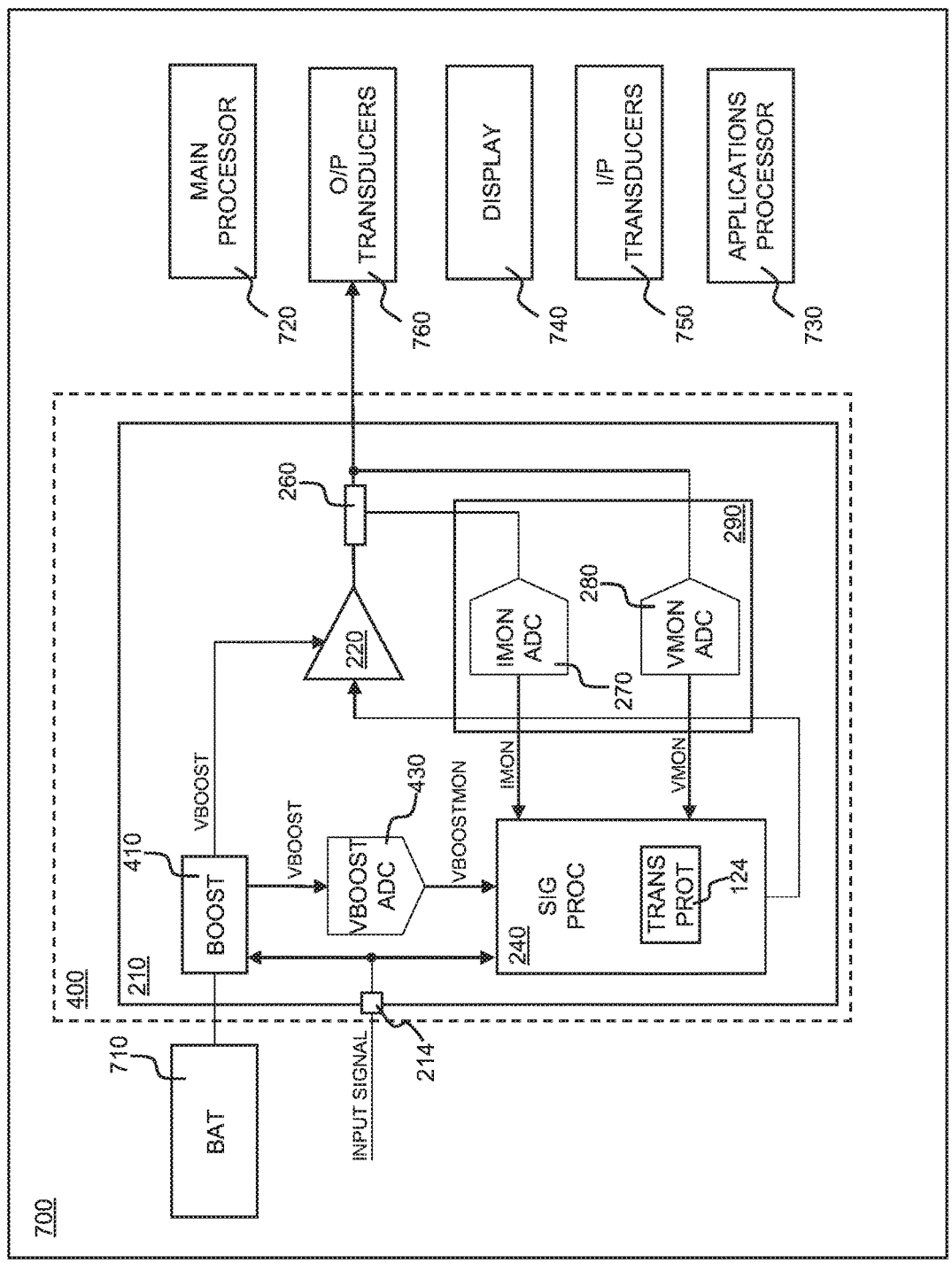
FIG. 7 is a schematic diagram illustrating a host device incorporating the circuitry of FIG. 4.

FIG. 7 is a schematic representation of such a device.

As shown in FIG. 7, the host device 700 may include an on-board battery 710 which provides a supply voltage VBAT to a boost converter 410 of the system 400.

The host device 700 may also include a main processor 720, an applications processor 730, and a display 740. The host device 700 may also include one or more input transducers and/or sensors 750, such as one or more microphones, touch screens, touch sensors, force sensors, switches, buttons, light sensors and the like. The host device 700 may also include one or more output transducers 760 such as one or more speakers, haptic output transducers, and the like, coupled to the output of the amplifier circuitry 220.

Although the system 400 has been described above as driving a transducer such as a speaker or haptic output transducer such as a linear resonant actuator, it will be apparent to those of ordinary skill in the art that the system 400 is capable of driving any load, and thus the principles, methods and processes described herein are not limited to driving a transducer but are equally applicable to driving any load.

Embodiments may be implemented in a range of applications and in particular are suitable for audio applications.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry comprising:
amplifier circuitry configured to receive a variable supply voltage, wherein the supply voltage varies according to an output signal of the amplifier circuitry;
monitoring circuitry configured to monitor one or more parameters of an output signal of the amplifier circuitry; and
processing circuitry configured to receive an indication of the voltage of the variable supply voltage and an indication of the monitored parameters from the monitoring circuitry and to apply a predetermined correction to one or more of the monitored parameters to compensate for coupling between the variable supply voltage and the monitoring circuitry.

2. The circuitry according to claim 1, wherein the coupling arises as a result of parasitic effects and/or as a result of component mismatches in the circuitry.

3. The circuitry according to claim 1, wherein the amplifier circuitry is operable as a Class-H or a Class-G amplifier.

4. The circuitry according to claim 1, further comprising boost converter circuitry configured to receive an input voltage and to output the supply voltage, wherein the boost circuitry is configured such that the supply voltage varies according to the output signal of the amplifier circuitry.

5. The circuitry according to claim 1, further comprising an analogue to digital converter (ADC) configured to receive an indication of the voltage of the variable supply voltage and to output a digital indication of the voltage of the variable supply voltage.

6. The circuitry according to claim 1, wherein the one or more parameters of the output signal comprises an output voltage or an output current.

7. The circuitry according to claim 6, wherein the monitoring circuitry comprises:
a first analogue to digital converter configured to receive an indication of the output voltage and to output a digital indication of the output voltage; and/or
a second analogue to digital converter configured to receive an indication of the output current and to output a digital indication of the output current.

8. The circuitry according to claim 1, wherein the circuitry is operable to:
receive a stimulus signal;
determine a value of the one or more monitored parameters of the output signal at a plurality of known values of the variable supply voltage resulting from the stimulus signal; and
based on the determined values of the one or more monitored parameters and the plurality of known values of the supply voltage, determine an error coefficient for use in compensating for the coupling between the supply voltage and the monitoring circuitry.

9. The circuitry according to claim 8, wherein the processing circuitry is configured to, in use:
generate a scaled version of the variable supply voltage by scaling the indication of the variable supply voltage by the error coefficient; and
subtract the scaled version of the variable supply voltage from the indication of the one or more monitored parameters.

10. The circuitry according to claim 8 wherein the stimulus signal comprises a step signal.

11. The circuitry according to claim 8 wherein the circuitry is further configured to compare the determined error coefficient to a predetermined expected range of error coefficients and to generate an alert the determined error coefficient falls outside of the predetermined expected range.

12. The circuitry according to claim 1, wherein the circuitry is configured to drive a load.

13. The circuitry according to claim 12, wherein the load comprises a transducer such as an audio transducer or a haptic transducer.

14. The circuitry according to claim 1, wherein the circuitry implements audio amplifier circuitry for amplifying an input audio signal.

15. Integrated circuitry comprising the circuitry according to claim 1.

16. A device comprising the circuitry according to claim 1, wherein the device comprises a mobile telephone, a tablet or laptop computer, a portable media player, a gaming device, a wearable device or an accessory device.

17. A method for measuring coupling in a system comprising amplifier circuitry having a variable supply voltage that varies according to an output signal of the amplifier circuitry, the method comprising:

applying a stimulus signal to cause the variable supply voltage to adopt one or more known calibration values;

measuring a change in one or more parameters of the output signal of the amplifier circuitry resulting from a change in the variable supply voltage in response to the stimulus signal;

based on the measured change in the one or more parameters of the output signal and the change in the variable supply voltage in response to the stimulus signal, determining an error coefficient; and scaling a value of the variable supply voltage using the determined error coefficient to generate an indication of the coupling.

18. A method according to claim 17 wherein the one or more parameters of the output signal comprises an output voltage or an output current.

19. A method according to claim 17 wherein the stimulus signal comprises a step signal.

20. An amplifier system comprising:

amplifier circuitry for driving an electromagnetic load;

boost circuitry for boosting a supply voltage to the amplifier;

monitoring circuitry for monitoring a load signal driving the load; and control circuitry for determining a level of coupling between the boost circuitry and the monitoring circuitry and applying a predetermined correction to the monitored load signal.

* * * * *